(12) United States Patent
Kao et al.

(10) Patent No.: US 10,473,830 B2
(45) Date of Patent: Nov. 12, 2019

(54) DISPLAY DEVICE WITH HAZE LAYER

(71) Applicant: AU Optronics Corporation, Hsin-Chu (TW)

(72) Inventors: Wang-Shuo Kao, Hsin-Chu (TW);
Yu-Han Chiang, Hsin-Chu (TW);
Ya-Chen Kao, Hsin-Chu (TW);
Kai-Chieh Chang, Hsin-Chu (TW);
Shang-Chiang Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/009,831

(22) Filed: Jun. 15, 2018

(65) Prior Publication Data
US 2018/0372928 A1 Dec. 27, 2018

(30) Foreign Application Priority Data

Jun. 22, 2017 (TW) .............................. 106121176 A

(51) Int. Cl.
*G02B 5/02* (2006.01)
*G02B 5/20* (2006.01)
*G02F 1/1335* (2006.01)
*H01L 27/32* (2006.01)

(52) U.S. Cl.
CPC ............ *G02B 5/021* (2013.01); *G02B 5/0278* (2013.01); *G02B 5/201* (2013.01); *G02F 1/133504* (2013.01); *G02F 1/133514* (2013.01); *G02F 2201/52* (2013.01); *H01L 27/3232* (2013.01)

(58) Field of Classification Search
CPC ...... G02B 5/021; G02B 5/0278; G02B 5/201; G02F 1/133504; G02F 1/133514; G02F 2201/52; H01L 27/3232
See application file for complete search history.

(56) References Cited

U.S. PATENT DOCUMENTS

| | | | | |
|---|---|---|---|---|
| 5,790,213 A | * | 8/1998 | Sasaki ................... | G02F 1/1368 349/48 |
| 2008/0259246 A1 | * | 10/2008 | Watanabe ......... | G02F 1/133606 349/64 |
| 2009/0213047 A1 | * | 8/2009 | Abe ........................ | G02F 1/167 345/76 |
| 2018/0341049 A1 | * | 11/2018 | Serizawa .................. | B32B 7/02 |

* cited by examiner

*Primary Examiner* — Sultan Chowdhury
*Assistant Examiner* — Magda Cruz
(74) *Attorney, Agent, or Firm* — WPAT, PC

(57) ABSTRACT

The present invention provides a display device including a display panel and a haze layer. The display panel includes a plurality of pixels and a color determining surface. The orthogonal projection of each of the plurality of pixels onto the color determining surface forms a plurality of adjacent pixel ranges. The haze layer is disposed on a side of the color determining surface and has a haze surface facing away from the color determining surface. The haze layer has a scattering coefficient ranging from −1.4 to 0. The haze surface includes a first location corresponding to the center of the first pixel range, and a second location corresponding to a location away from the first edge towards the second pixel range wherein the distance therebetween ranges from 87 μm to 174 μm.

17 Claims, 7 Drawing Sheets

DISPLAY DEVICE WITH HAZE LAYER

FIELD OF THE INVENTION

The present invention relates to a display device; more particularly, to a display device with a haze layer.

BACKGROUND

Display devices with planar or curved surface have already been widely used in various kinds of computer devices, e.g. mobile phones, personal wearable devices, televisions, host computers of transportation equipment, personal computers, digital cameras, and handheld video games. However, the display industries are still endeavoring to bring improvements to the optical performance of display devices so as to enhance the user experience.

For instance, glare on display screens induced by ambient light is often an issue to be solved. The glare effects are unpleasant and reduce the optical performance of displays. To solve the aforementioned problem, some conventional displays are equipped with a haze layer with a high haze value on the display surface so as to reduce glare. However, a haze layer of high haze value refracts light easily, thus rendering the refracted light beams interfering with each other. When light beams generated by edge pixels of a display interfere with each other, the display produces blurry images with low resolution, thus harming the user experience.

SUMMARY OF THE INVENTION

Accordingly, an objective of the present invention is to provide a display device that lowers the optical interference between adjacent pixels.

Another objective of the present invention is to provide a display device that reduces the blurring effects without sacrificing much haze value of the haze layer on the screen surface.

The display device includes a display panel and a haze layer. The display panel includes a plurality of pixels and a color determining surface. An orthogonal projection of each of the plurality of pixels onto the color determining surface forms a pixel range, and each pixel range has a width p. The haze layer is disposed on a side of the color determining surface. The haze layer has a scattering coefficient s preferably ranging from $-1.4$ to $0$ so as to reduce glare and enhance optical performance. The haze layer defines a reference surface, and the distance between the color determining surface and the reference surface is d. The scattering coefficient s, the width p and the distance d satisfy the relation:

$$\left| 2 \left( \frac{\begin{pmatrix} 10^{-8(1+S)} \text{Hypergeometric2}F1 \\ \left[ 2 + \frac{S}{2}, \frac{1+S}{2}, 1 + \frac{1+S}{2}, (-10)^{-16} \right] - 2^{\left[ -1-S\left(1+\frac{1}{4c^2}\right)^{\frac{S}{2}} \right]} \\ \left( \frac{1}{c\sqrt{1+\frac{1}{4c^2}}} \right)^S \\ \text{Hypergeometric2}F1\left[ 2 + \frac{S}{2}, \frac{1+S}{2}, 1 + \frac{1+S}{2}, \frac{-1}{4c^2} \right] \end{pmatrix}}{c} \right) \middle/ \left( \frac{\begin{pmatrix} k\left( \frac{k}{c\sqrt{1+\frac{k^2}{c^2}}} \right)^S \left( 1 + \frac{k^2}{c^2} \right)^{\frac{S}{2}} \text{Hypergeometric2}F1 \\ \left[ 2 + \frac{S}{2}, \frac{1+S}{2}, 1 + \frac{1+S}{2}, \frac{-k^2}{c^2} \right] - (1+k) \\ \left( \frac{1+k}{c\sqrt{1+\frac{(1+k)^2}{c^2}}} \right)^S \left( 1 + \frac{(1+k)^2}{c^2} \right)^{\frac{S}{2}} \\ \text{Hypergeometric2}F1\left[ 2 + \frac{S}{2}, \frac{1+S}{2}, 1 + \frac{1+S}{2}, \frac{-(1+k)^2}{c^2} \right] \end{pmatrix}}{(c)} \right) \right| \geq 10,$$

in which $c=d/p$ and $k=174$ μm/p.

According to another embodiment of the present invention, the display device includes a display panel and a haze layer. The display panel has a first pixel, a second pixel and a color determining surface. An orthogonal projection of the first pixel and that of the second pixel form a first pixel range and a second pixel range respectively, in which the first pixel range has a first edge adjacent to the second pixel range. The haze layer is disposed on a side of the color determining surface and has a haze surface facing away from the color determining surface. The haze layer has a scattering coefficient ranging from $-1.4$ to $0$. The haze surface includes a first location and a second location. The first location corresponds to the center of the first pixel range, and the second location corresponds to a location away from the first edge towards the second pixel range in which the distance therebetween ranges from 87 μm to 174 μm. When the first pixel is in full bright and the second pixel is in full dark, the brightness at the first location is ten times greater than that at the second location.

DETAILED DESCRIPTION OF EMBODIMENTS

The present invention provides a display device, e.g. a display device with a haze surface in one embodiment of the present invention. The display device is preferably a computer display, a television, a monitor, a car computer, etc. In addition, the display device can be applied to other electronic devices such as mobile phones, digital cameras and handheld video games.

Figure 1:
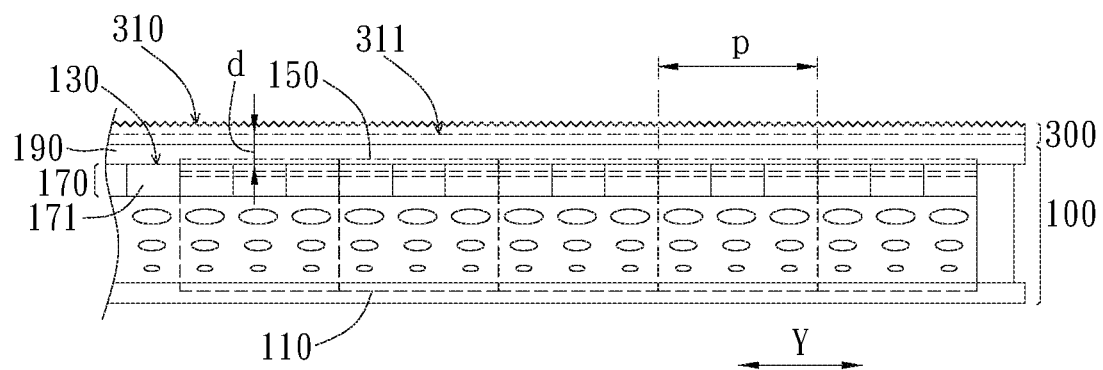
FIG. 1 is a cross-sectional schematic view illustrating a display device according to one embodiment of the present invention.

Referring to FIG. 1, according to one embodiment of the present invention, the display device includes a display panel 100 and a haze layer 300. The display panel 100 includes a plurality of pixels 110 and a color determining surface 130. Each pixel 110 is preferably formed of a single subpixel or a plurality of subpixels as a controllable unit when displaying images. As shown in FIG. 1, the color determining surface 130 is the display surface where the display panel 100 shows images. The orthogonal projection of each pixel 110 forms a pixel range 150 on the color determining surface 130. In this embodiment, each pixel range 150 has a width p in the transverse direction Y.

In this embodiment, the display panel 100 includes a color determining layer 170. In the embodiment shown in FIG. 1, the display panel 100 is a liquid crystal display panel, and the color determining layer 170 is a color resistance layer including a plurality of color resistance units 171. The plurality of pixels 110 are grouped according to the arrangement of the color resistance units 171. Moreover, the pixels 110 can also be grouped by signal lines, for example, scan lines or data lines, of the control circuit inside the display panel 100. Furthermore, in another embodiment wherein the display panel 100 is a self-emissive display panel, the display panel 100 has a color determining layer 170 formed of a plurality of self-emissive components, e.g. OLED components, whose arrangement serves to make boundaries between pixels. The plurality of pixels 110 are preferably arranged in an array. The array can be orthogonal or hexagonal, e.g. a beehive arrangement, or in other shapes but in a regularly repeated pattern. In addition, the area of each pixel 110 can also be determined by the repeated pattern of the control circuit or display medium arranged in the transverse direction Y. In other words, each pixel 110 has a repeated structure that is also included in each of the other pixels 110. The electrode of the control circuit, the color resistances or the edge of the self-emissive materials can be where the repeated structure starts, and the area between two repeated structures is defined as a pixel 110.

With reference to FIG. 1, the haze layer 300 is disposed on a side of the color determining surface 130, in particular, on the side where images are displayed. The haze layer 300 can be an independent optical film, a layer of coating or deposition disposed on the translucent substrate 190 or the polarizer plate of the display panel 100. The haze layer 300 has a haze surface 310 facing away from the color determining surface 130. The haze layer 300 has a scattering coefficient s preferably ranging from 0 to −1.4 so as to reduce glare and enhance the optical performance. In this embodiment, the scattering coefficient s is defined by the relation: $BTDF = b(100|\sin\theta_{output} - \sin\theta_{input}|)^s$, with BTDF referring to a bidirectional transmission distribution function, b to a constant, $\sin\theta_{output}$ to the emergence angle of a testing light beam and $\sin\theta_{input}$ to the incidence angle of the testing light beam. The testing is performed by emitting the testing light to the rear side of the haze surface 310 and measuring the distribution of light transmitted through the haze surface 310. Next, the distribution is functionalized, and the aforementioned bidirectional transmission distribution function is derived. When the scattering coefficient s increases, the haze value increases. In the present embodiment where the scattering coefficient s ranges from −1.4 to 0, the haze value is at its minimum value when the scattering coefficient s is −1.4.

Referring to FIG. 1, the haze surface 310 has a reference surface 311. In this embodiment, the haze surface 310 is a rough surface formed of many rough structures or micro structures. The rough surface has a virtual mean height surface that is defined by 50% or 75% of the maximum height. Alternatively, 75% of the maximum height is defined as the reference surface 311. For instance, if the bottom surface of the haze layer 300 is defined as a reference surface whose height is zero, then each point on the rough surface has a relative height with respect to the reference surface. After performing statistical analysis on the height of each point, the second or the third quartile is taken as the height of the reference surface 311. The above analysis can be performed using an optical stereoscope and analyzing the heights of each haze point.

The distance between the color determining surface 130 and the reference surface 311 is d. In this embodiment, the distance d is the shortest distance between the color determining surface 130 and the reference surface 311 in the direction normal to the color determining surface 130. In the embodiment shown in FIG. 1, the display panel 100 includes the color determining layer 170, and the top surface of the color determining layer 170 is the color determining surface 130. As shown in FIG. 1, the color determining layer 170 is covered by the translucent substrate 190, which can be exemplified as a glass substrate, and the haze layer 300 is disposed on the outer surface of the translucent substrate 190. If the reference surface 311 is the mean height surface of the haze surface 310, the distance d is the thickness of the translucent substrate 190 plus the average height of the haze surface 310 relative to the bottom surface of the haze layer 300.

However, in other embodiments, the color determining layer 170 which acts as the color resistance layer can also be disposed on a lower substrate, and the electrodes, liquid crystal components and the upper translucent substrate are disposed on the color determining layer 170. In this structural manner, the top surface of the color determining layer 170 facing the haze layer 300 is still the color determining surface 130 serving to determine the distance d between the color determining surface 130 and the reference surface 311. Furthermore, in other embodiments where the color determining layer 170 is formed of self-emissive components such as OLED components, the color determining surface 130 can still be the top surface of the color determining layer 170 that faces the haze layer 300. The aforementioned layers, substrates and distance are preferably measured by physical method such as taking cross-sectional slices and analyzing using optical microscope; however, the present invention is not limited thereto.

Figure 2A:
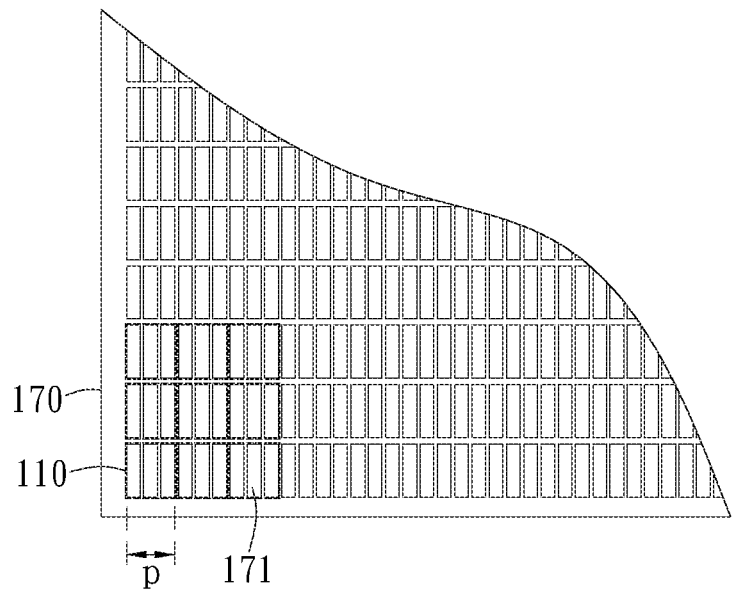
FIG. 2A is a schematic view illustrating a plurality of pixels with each of which being formed of a plurality of color resistance units according to one embodiment of the present invention.
Figure 2B:
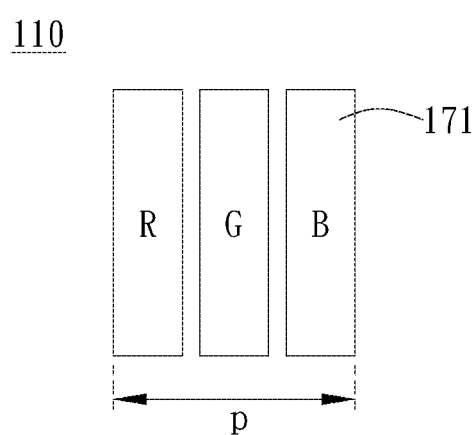
FIG. 2B is an enlarged view of one of the pixels of FIG. 2A.

FIG. 2A shows a plurality of pixels 110, each being formed of a plurality of color resistance units 171 according to one embodiment of the present invention. FIG. 2B is an enlarged view of one of the pixels 110. In the present embodiment, the area of a pixel 110 is defined by a red color resistance unit, a green color resistance unit, and a blue color resistance unit. In other words, the color resistance units 171 of different colors are preferably used in one pixel so as to jointly achieve the required color and brightness of the pixel. In other embodiments, color resistance units 171 of other colors, such as white, can also be added into the pixels. With reference to FIG. 2B, the color resistance units 171 of different colors are arranged side by side, and the orthogonal projection of these color resistance units 171 substantially form a rectangle. In the present embodiment, the width p is the shorter side of the rectangle. In other words, width p is the aggregation of the short side of each of the color resistance units 171. However, in other embodiments wherein the longer side of the color resistance units 171 is shorter than the aggregated value of the short sides of the three color resistance units 171, the long side of the color resistance unit 171 is taken as the width p.

Figure 2C:
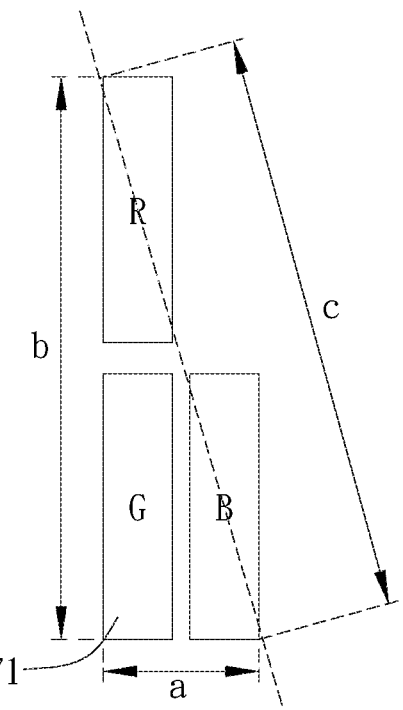
FIG. 2C is a schematic view illustrating another pixel formed of a plurality of color resistance units according to one embodiment of the present invention.
Figure 2D:
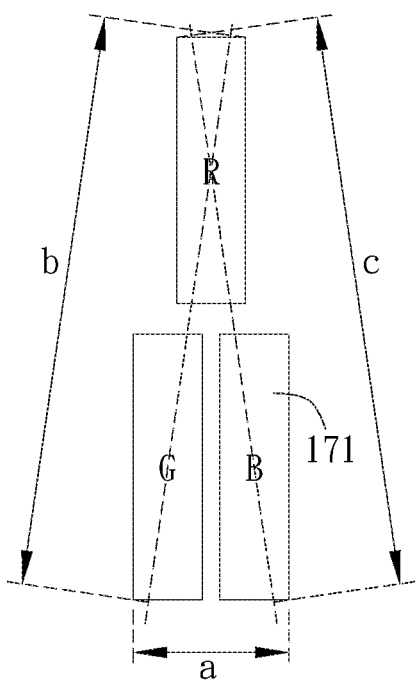
FIG. 2D is a schematic view illustrating yet another pixel formed of a plurality of color resistance units according to one embodiment of the present invention.

FIGS. 2C and 2D show another two pixels 110 respectively defined by a plurality of color resistance units 171. In these two embodiments, the color resistance units 171 are arranged in different ways, thereby forming areas that are not in a rectangular shape as that in the previous embodiment. In each of the aforementioned embodiments, the area formed of the color resistance units 171 has projection lengths each defined by every two adjacent pixels, the shortest of which is assigned to be the width p. For instance, the color resistance units 171 shown in FIG. 1C has projection lengths a, b and c on each direction along which two of the color resistance units 171 are aligned. The projection length a is the shortest, hence assigned to be the width p.

The aforementioned areas, lengths, and width of the color resistance units 171 and pixels can be measured using an optical measuring method, e.g using an optical microscope. However, the present invention is not limited thereto.

Figure 3:
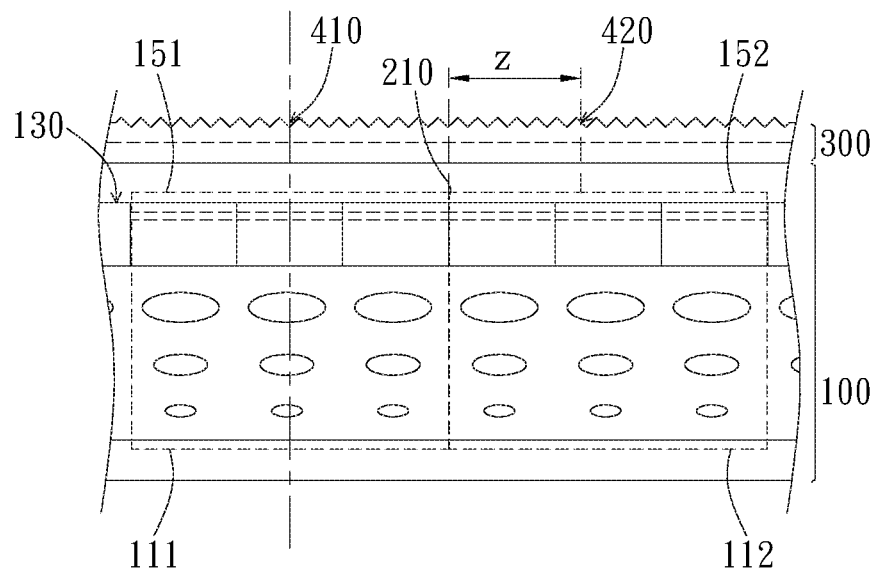
FIG. 3 is a partially enlarged view of the display device according to one embodiment of the present invention.

FIG. 3 shows two adjacent pixels 110, i.e. the first pixel 111 and the second pixel 112 in the display panel 100. In this embodiment, the orthogonal projection of the first pixel 111 and the second pixel 112 onto the color determining surface 130 respectively forms the first pixel range 151 and the second pixel range 152. The first pixel range 151 has a first edge 210 adjacent to the second pixel 112. The haze surface 310 has a first location 410 and a second location 420. The first location 410 corresponds to the center of the first pixel range 151. Preferably, the orthogonal projection of the first location 410 onto the color determining surface 130 falls within the first pixel range 151. The second location 420 corresponds to a point extending from the first edge 210 towards the second pixel range 152 in which the distance between the first edge 210 and the second location 420 is Z. The distance Z preferably ranges from 87 μm to 174 μm. In one embodiment of the present invention, the orthogonal projection of the second location 420 onto the color determining surface 130 is situated within a range of 87 μm to 174 μm from the first edge 210.

When the first pixel 111 is in full bright and the second pixel 112 is in full dark, the brightness at the first location 410 is ten times greater than that at the second location 420. Preferably, the brightness can be measured by taking the image of the haze surface 310 outside the haze surface 310 using an image sensor such as a camera, in which the brightness value of each location can be derived. Due to the limits of human vision, slight differences in an image are imperceptible. For example, it has been established through experiments that the human ability to perceive a difference in an image declines when the size of the difference is less than 0.4 to 1 arcmin. With the aforementioned technical means, if an appropriate viewing distance is adopted, e.g. a viewing distance greater than 30 cm to 60 cm and when the first pixel 111 is on the image edge and the second pixel 112 is arranged outside the image, the interference between the second pixel 112 and the first pixel 111 can be lowered, thereby enhancing the image contrast and achieving higher resolution.

Preferably, full bright means providing certain pixels with display signals of displaying maximum brightness or full white. On the other hand, full dark means providing certain pixels with display signals of displaying minimum brightness, full dark or switching off. In one embodiment of the present invention wherein the first pixel 111 is in full bright and the second pixel 112 is in full dark, the brightness at the center of the second pixel range 152 is smaller than or equal to 10% of the brightness at the center of the first pixel range 151.

In one embodiment, the width p, the scattering coefficient s and the distance d satisfy the following relation:

$$\left| \frac{\left( \begin{array}{c} 10^{-8(1+S)} \text{Hypergeometric2F1} \\ \left[ 2 + \frac{S}{2}, \frac{1+S}{2}, 1 + \frac{1+S}{2}, (-10)^{-16} \right] - \\ 2^{\left[ -1 - S\left(1 + \frac{1}{4c^2}\right)^{\frac{S}{2}} \right]} \left( \frac{1}{c\sqrt{1 + \frac{1}{4c^2}}} \right)^S \\ \text{Hypergeometric2F1}\left[ 2 + \frac{S}{2}, \frac{1+S}{2}, 1 + \frac{1+S}{2}, \frac{-1}{4c^2} \right] \end{array} \right)}{\left( \begin{array}{c} k\left( \frac{k}{c\sqrt{1 + \frac{k^2}{c^2}}} \right)^S \left( 1 + \frac{k^2}{c^2} \right)^{\frac{S}{2}} \text{Hypergeometric2F1} \\ \left[ 2 + \frac{S}{2}, \frac{1+S}{2}, 1 + \frac{1+S}{2}, \frac{-k^2}{c^2} \right] - \\ (1+k)\left( \frac{1+k}{c\sqrt{1 + \frac{(1+k)^2}{c^2}}} \right)^S \left( 1 + \frac{(1+k)^2}{c^2} \right)^{\frac{S}{2}} \\ \text{Hypergeometric2F1}\left[ 2 + \frac{S}{2}, \frac{1+S}{2}, 1 + \frac{1+S}{2}, \frac{-(1+k)^2}{c^2} \right] \end{array} \right)} \right| \geq 10,$$

in which c=d/p and k=174 μm/p. With the abovementioned technical solution, the scattering effects induced by the haze layer 300 can be reduced, thereby lowering the interference between adjacent pixels. For instance, the brightness difference between a point inside a pixel and a point 174 μm away from the pixel can be up to ten times the brightness of the pixel. In other words, since the interference between adjacent pixels is reduced, especially for pixels on the image edge, the image contrast is enhanced, thereby sharpening the edges of the image.

Figure 4:
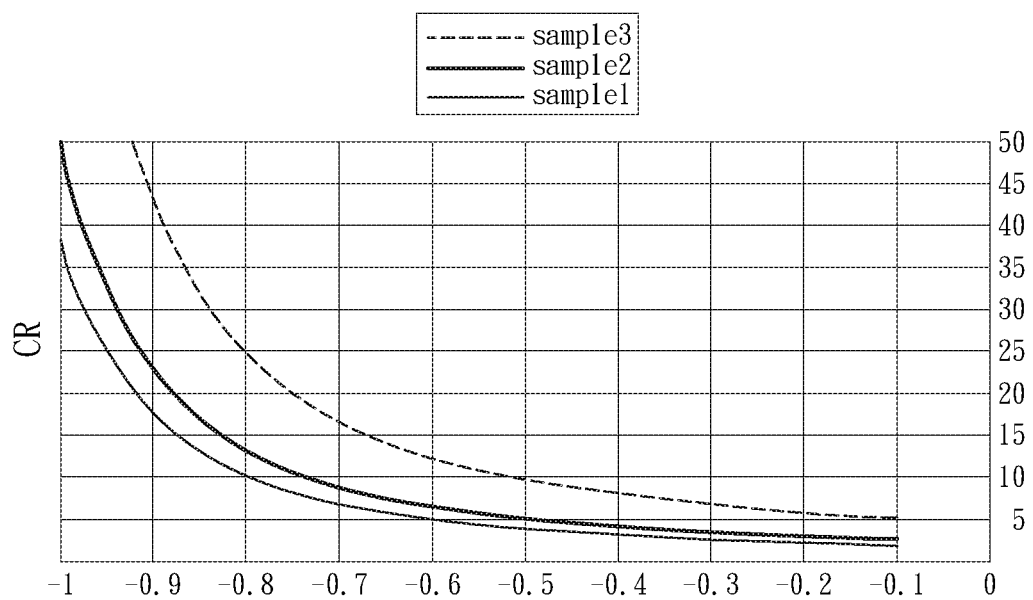
FIG. 4 is a line chart illustrating the variation in the brightness ratio of adjacent pixels at various combinations of different distance values d and the same width p.

FIG. 4 is an exemplary embodiment showing the variation in brightness ratio CR of adjacent pixels at various combinations of the distance d of different values and the same width p. The vertical axis represents the brightness ratio CR of the center of the first pixel range to a point outside the first pixel range and 87 μm away from the first edge 210. The horizontal axis represents the scattering coefficient s. The distance values d, the width p, and the value of the ratio d/p therebetween adopted by the three embodiments are shown as follows:

|  | Sample 9 | Sample 10 | Sample 11 |
| --- | --- | --- | --- |
| width p |  | 465 μm |  |
| distance d | 0.68 mm | 0.48 mm | 0.28 mm |
| d/p | 1.462 | 1.032 | 0.602 |

It can be derived from FIG. 4 that, at the same width p and the same scattering coefficient s, the CR increase when the distance d decreases, namely the brightness contrast and image sharpness are increased. In order to achieve a CR value higher than 10 so as to get images of high sharpness, the upper limit of the scattering coefficient s of the haze layer is preferably:

|  | Sample 1 | Sample 2 | Sample 3 |
| --- | --- | --- | --- |
| width p |  | 465 μm |  |
| Distance d | 0.68 mm | 0.48 mm | 0.28 mm |
| d/p | 1.462 | 1.032 | 0.602 |
| Scattering coefficient s | −0.796 | −0.73 | −0.512 |

It can be seen from the data of sample 1 that higher image sharpness can be derived when the scattering coefficient is smaller than or equal to −0.796 and the distance is smaller than or equal to 0.68 mm. From that of sample 1, higher image sharpness can be derived when the scattering coefficient s is smaller than or equal to −0.73 and the distance d is smaller than or equal to 0.48 mm. From that of sample 3, higher image sharpness can be derived when the scattering coefficient s is smaller than or equal to −0.512 and the distance d is smaller than or equal to 0.28 mm.

Figure 5:
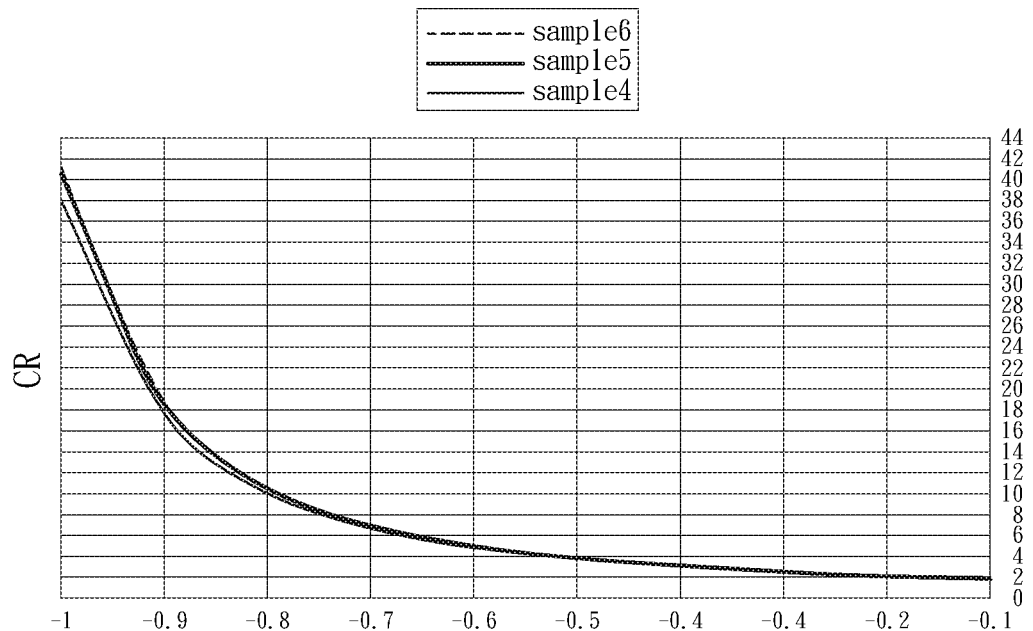
FIG. 5 is a line chart illustrating the variation in the brightness ratio of adjacent pixels at various combinations of the same distance d and width p of different values.

FIG. 5 illustrates the variation in the brightness ratio CR of adjacent pixels at various combinations of the same distance d and the width p of different values. The vertical axis represents the brightness ratio CR of the center of the first pixel range to a point outside the first pixel range and 174 μm away from the first edge 210. The horizontal axis represents the scattering coefficient s. The width p, distance d and the ratio d/p therebetween of the three embodiments are shown in the table below:

|  | Sample 4 | Sample 5 | Sample 6 |
| --- | --- | --- | --- |
| width p | 455 μm | 372 μm | 363.61 μm |
| distance d |  | 0.68 mm |  |
| d/p | 1.462 | 1.828 | 1.87 |

It can be derived from FIG. 5 that, at the same distance d and the same scattering coefficient s of the haze layer, it is easier to achieve the same CR with varying width p. In order to achieve a CR value higher than 10 so as to get images of high sharpness, the upper limit of the scattering coefficient s of the haze layer is preferably:

|  | Sample 4 | Sample 5 | Sample 6 |
| --- | --- | --- | --- |
| width p | 455 μm | 372 μm | 363.61 μm |
| distance d |  | 0.68 mm |  |
| d/p | 1.462 | 1.828 | 1.87 |
| scattering coefficient s | −0.796 | −0.751 | −0.75 |

Figure 6:
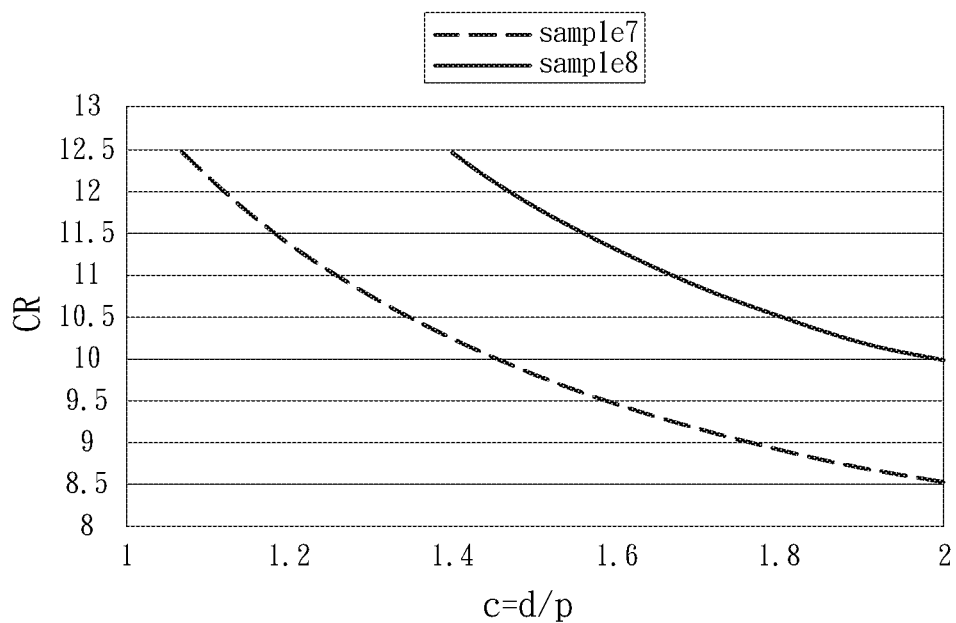
FIG. 6 is a line chart illustrating the variation in the brightness ratio of adjacent pixels at various combinations of distance d and width p.

FIG. 6 illustrates the variation in the brightness ratio CR of adjacent pixels at various combinations of distance d to width p. The vertical axis represents the brightness ratio CR of the center of the first pixel range to a point outside the first pixel range and 174 μm away from the first edge. The horizontal axis represents the ratio c of the distance d to the width p. The width p, distance d and the ratio d/p therebetween of the three embodiments are shown in the table below:

|  | Sample 7 | Sample 8 |
| --- | --- | --- |
| width p | 465 μm | 372 μm |
| distance d | 0.677 mm | 0.735 mm |
| d/p | 1.457 | 2 |
| scattering coefficient s |  | −0.796 |

It can be seen from the data of sample 7 that higher image sharpness can be achieved when the ratio c is smaller than or equal to 2. From that of sample 8, higher image sharpness can be derived when the ratio c of the distance d to the width p is smaller than or equal to 1.457.

Figure 7:
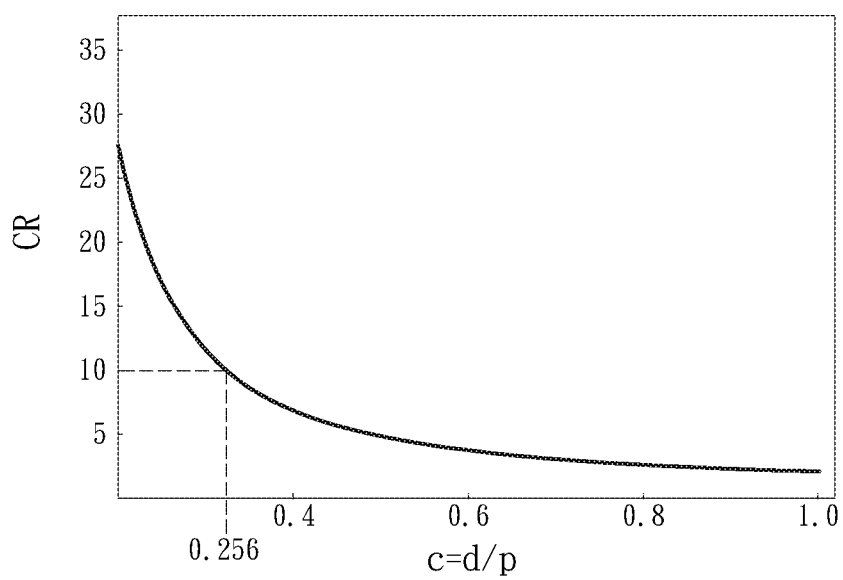
FIG. 7 is a line chart illustrating the relationship between the brightness ratio of the center of the first pixel range to the location 174 μm away from the first edge and the ratio value c of the distance d to the width p.

FIG. 7 shows the relationship between the brightness ratio CR of the center of the first pixel range to the location 174 μm away from the first edge and the ratio value c of distance d to the width p when the scattering coefficient s is −0.01. As shown in FIG. 7, as the ratio c decreases, the ratio CR increases, namely the brightness contrast and the sharpness are enhanced. In the present embodiment, the CR value higher than 10 can be obtained when the ratio c is no greater than 0.256, thereby maintaining higher image sharpness. Since the scattering coefficient s of −0.01 is pretty high, it can be derived that when the ratio c is no greater than 0.256, images of high sharpness can be obtained for most devices equipped with a haze unit.

According to another embodiment of the present invention, the width p, the scattering coefficient s, and the distance d satisfy the below relation:

$$2 \left| \frac{\begin{pmatrix} 10^{-8(1+S)} \text{Hypergeometric2F1} \\ \left[2+\frac{S}{2}, \frac{1+S}{2}, 1+\frac{1+S}{2}, (-10)^{-16}\right] - \\ 2^{\left[-1-S\left(1+\frac{1}{4c^2}\right)^{\frac{S}{2}}\right]} \left(\frac{1}{c\sqrt{1+\frac{1}{4c^2}}}\right)^S \\ \text{Hypergeometric2F1}\left[2+\frac{S}{2}, \frac{1+S}{2}, 1+\frac{1+S}{2}, \frac{-1}{4c^2}\right] \end{pmatrix}}{c} \right| \geq 10,$$

$$\left| \frac{\begin{pmatrix} x\left(\frac{x}{c\sqrt{1+\frac{x^2}{c^2}}}\right)^S \left(1+\frac{x^2}{c^2}\right)^{\frac{S}{2}} \text{Hypergeometric2F1} \\ \left[2+\frac{S}{2}, \frac{1+S}{2}, 1+\frac{1+S}{2}, \frac{-x^2}{c^2}\right] - \\ (1+x)\left(\frac{1+x}{c\sqrt{1+\frac{(1+x)^2}{c^2}}}\right)^S \left(1+\frac{(1+x)^2}{c^2}\right)^{\frac{S}{2}} \\ \text{Hypergeometric2F1}\left[2+\frac{S}{2}, \frac{1+S}{2}, 1+\frac{1+S}{2}, \frac{-(1+x)^2}{c^2}\right] \end{pmatrix}}{c} \right|$$

in which c=d/p and x=87 μm/p. With the above technical solution, the scattering effects of the haze layer 300 can be further reduced, thereby lowering the interference between adjacent pixels. For instance, the brightness difference between a point inside a pixel and a point 87 μm away from the pixel can be up to ten times the brightness of the pixel. In other words, since the interference between adjacent pixels is reduced, especially for pixels on the image edge, the image contrast is enhanced, thereby sharpening the edges of the image.

Figure 8:
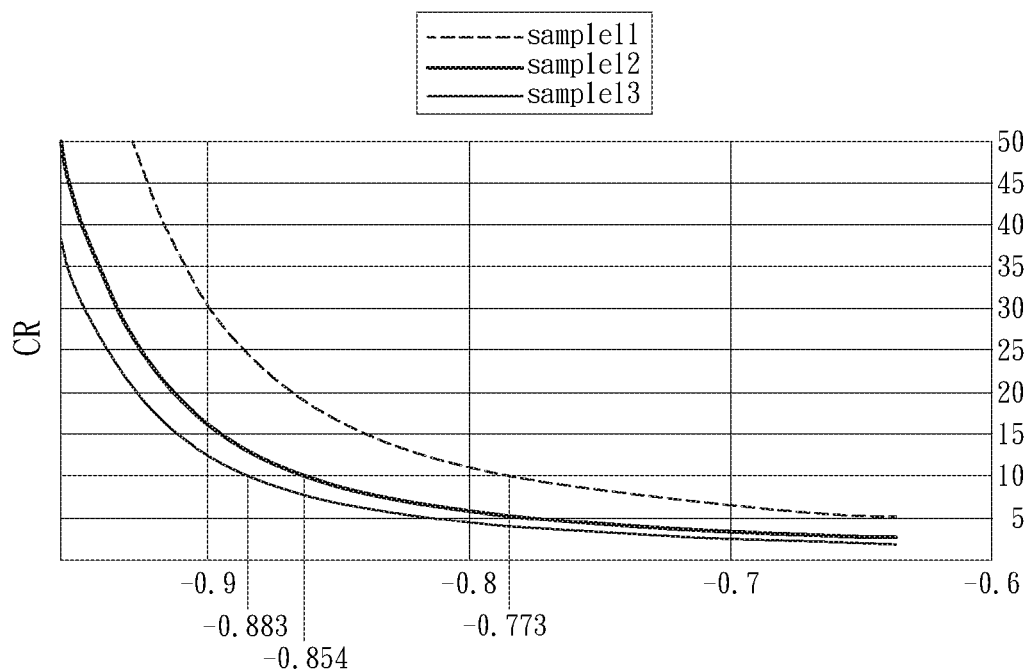
FIG. 8 is another line chart illustrating the variation in the brightness ratio of adjacent pixels at various combinations of different distance values d and the same width p.

FIG. 8 is another exemplary embodiment illustrating the variation in the brightness ratio of adjacent pixels at various combinations of distance d of different values and the same width p. The vertical axis represents the brightness ratio CR of the center of the first pixel range to a point outside the first pixel range and 174 μm away from the first edge. The horizontal axis represents the scattering coefficient s. The distance values d, the width p, and the ratio d/p therebetween of the three embodiments are shown as follows:

|  | Sample 9 | Sample 10 | Sample 11 |
| --- | --- | --- | --- |
| width p |  | 465 μm |  |
| distance d | 0.68 mm | 0.48 mm | 0.28 mm |
| d/p | 1.462 | 1.032 | 0.602 |

It can be derived from FIG. 8 that, at the same width p and the same scattering coefficient s of the haze layer, the ratio CR increases when the distance d decreases, namely the brightness contrast is enhanced and higher image sharpness is achieved. In order to achieve a CR value higher than 10 so as to get images of high sharpness, the upper limit of the scattering coefficient s of the haze layer is preferably:

|  | Sample 9 | Sample 10 | Sample 11 |
| --- | --- | --- | --- |
| width p |  | 465 μm |  |
| distance d | 0.68 mm | 0.48 mm | 0.28 mm |
| d/p | 1.462 | 1.032 | 0.602 |
| scattering coefficient s | −0.883 | −0.854 | −0.773 |

It can be derived from the data of sample 9 that higher image sharpness can be achieved when the scattering coefficient s is smaller than or equal to −0.883 and the distance d is smaller than or equal to 0.68 mm. From that of sample 10, higher image sharpness can be achieved when the scattering coefficient s is smaller than or equal to −0.854 and the distance d is smaller than or equal to 0.48 mm. From that of sample 11, higher image sharpness can be achieved when the scattering coefficient s is smaller than or equal to −0.773 and the distance d is smaller than or equal to 0.28 mm.

Figure 9:
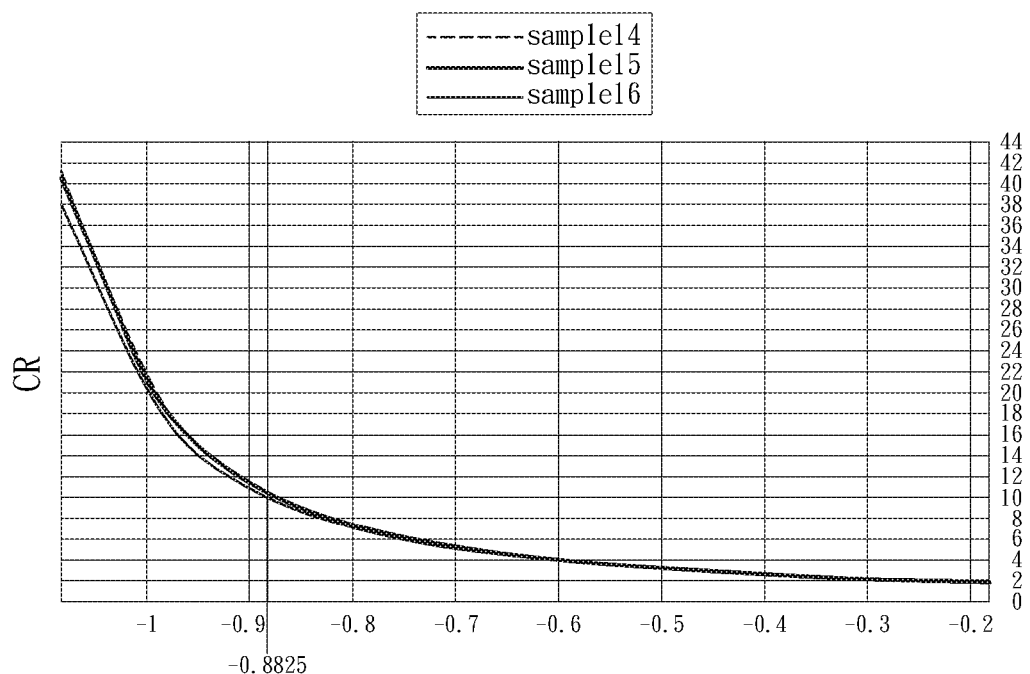
FIG. 9 is another line chart illustrating the variation in the brightness ratio of adjacent pixels at various combinations of the same distance d and different width values p.

FIG. 9 is another exemplary embodiment showing the variation in the brightness ratio of adjacent pixels at various combinations of the same distance d and different width values p. The vertical axis represents the brightness ratio CR of the center of the first pixel range to a point outside the first pixel range and 87 μm away from the first edge. The horizontal axis represents the scattering coefficient s. The distance values d, the width p, and the ratio d/p therebetween of the three embodiments are shown as follows:

|  | Sample 12 | Sample 13 | Sample 14 |
| --- | --- | --- | --- |
| width p | 455 μm | 372 μm | 363.61 μm |
| distance d |  | 0.68 mm |  |
| d/p | 1.462 | 1.828 | 1.87 |

It can be derived from FIG. 9 that, at the same distance d and the same scattering coefficient s of the haze layer, it is easier to achieve the same CR with varying width p. In order to achieve a CR value higher than 10 so as to get images of high sharpness, the upper limit of the scattering coefficient s of the haze layer is preferably:

|  | Sample 12 | Sample 13 | Sample 14 |
| --- | --- | --- | --- |
| width p | 455 μm | 372 μm | 363.61 μm |
| distance d |  | 0.68 mm |  |
| d/p | 1.462 | 1.828 | 1.87 |
| scattering coefficient s | −0.8825 | −0.8749 | −0.8739 |

The descriptions illustrated supra set forth simply the embodiments of the instant disclosure, and the characteristics of the present invention are by no means restricted thereto. All changes, alterations, or modifications conveniently considered by those skilled in the art are deemed to be encompassed within the scope of the instant disclosure delineated by the following claims.

What is claimed is:

1. A display device, comprising:
    a display panel including a plurality of pixels and a color determining surface, wherein an orthogonal projection of each of the plurality of pixels onto the color determining surface forms a pixel range, each pixel range having a width p; and
    a haze layer disposed on a side of the color determining surface, the haze layer having a scattering coefficient s ranging from −1.4 to 0,
    wherein the haze layer has a haze surface facing away from the color determining surface, in which the haze layer defines a reference surface, and the distance between the color determining surface and the reference surface is d, and wherein the scattering coefficient s, the width p and the distance d satisfy the relation:

$$2\left|\left(\frac{\begin{pmatrix}10^{-8(1+S)}\text{Hypergeometric2}F1\\ \left[2+\dfrac{S}{2},\dfrac{1+S}{2},1+\dfrac{1+S}{2},(-10)^{-16}\right]-\\ 2^{\left[-1-S\left(1+\frac{1}{4c^2}\right)^{\frac{S}{2}}\right]}\left(\dfrac{1}{c\sqrt{1+\dfrac{1}{4c^2}}}\right)^S\\ \text{Hypergeometric2}F1\left[2+\dfrac{S}{2},\dfrac{1+S}{2},1+\dfrac{1+S}{2},\dfrac{-1}{4c^2}\right]\end{pmatrix}}{c}\right)\right|\Big/\left|\left(\frac{\begin{pmatrix}k\left(\dfrac{k}{c\sqrt{1+\dfrac{k^2}{c^2}}}\right)^S\left(1+\dfrac{k^2}{c^2}\right)^{\frac{S}{2}}\text{Hypergeometric2}F1\\ \left[2+\dfrac{S}{2},\dfrac{1+S}{2},1+\dfrac{1+S}{2},\dfrac{-k^2}{c^2}\right]-\\ (1+k)\left(\dfrac{1+k}{c\sqrt{1+\dfrac{(1+k)^2}{c^2}}}\right)^S\left(1+\dfrac{(1+k)^2}{c^2}\right)^{\frac{S}{2}}\\ \text{Hypergeometric2}F1\left[2+\dfrac{S}{2},\dfrac{1+S}{2},1+\dfrac{1+S}{2},\dfrac{-(1+k)^2}{c^2}\right]\end{pmatrix}}{c}\right)\right|\geq 10,$$

in which $c=d/p$ and $k=174$ μm/p.

2. The display device of claim 1, wherein the haze layer is a rough surface, and the reference surface is a mean height surface of the rough surface.

3. The display device of claim 1, wherein the scattering coefficient s is smaller than or equal to −0.512, and the distance d is smaller than or equal to 0.28 mm.

4. The display device of claim 1, wherein the scattering coefficient s is smaller than or equal to −0.796, and the distance d is smaller than or equal to 0.68 mm.

5. The display device of claim 1, wherein the scattering coefficient s, and the width d and the distance d satisfy the relation:

$$2\left|\left(\frac{\begin{pmatrix}10^{-8(1+S)}\text{Hypergeometric2}F1\\ \left[2+\dfrac{S}{2},\dfrac{1+S}{2},1+\dfrac{1+S}{2},(-10)^{-16}\right]-\\ 2^{\left[-1-S\left(1+\frac{1}{4c^2}\right)^{\frac{S}{2}}\right]}\left(\dfrac{1}{c\sqrt{1+\dfrac{1}{4c^2}}}\right)^S\\ \text{Hypergeometric2}F1\left[2+\dfrac{S}{2},\dfrac{1+S}{2},1+\dfrac{1+S}{2},\dfrac{-1}{4c^2}\right]\end{pmatrix}}{c}\right)\right|\Big/\left|\left(\frac{\begin{pmatrix}x\left(\dfrac{x}{c\sqrt{1+\dfrac{x^2}{c^2}}}\right)^S\left(1+\dfrac{x^2}{c^2}\right)^{\frac{S}{2}}\text{Hypergeometric2}F1\\ \left[2+\dfrac{S}{2},\dfrac{1+S}{2},1+\dfrac{1+S}{2},\dfrac{-x^2}{c^2}\right]-\\ (1+x)\left(\dfrac{1+x}{c\sqrt{1+\dfrac{(1+x)^2}{c^2}}}\right)^S\left(1+\dfrac{(1+x)^2}{c^2}\right)^{\frac{S}{2}}\\ \text{Hypergeometric2}F1\left[2+\dfrac{S}{2},\dfrac{1+S}{2},1+\dfrac{1+S}{2},\dfrac{-(1+x)^2}{c^2}\right]\end{pmatrix}}{c}\right)\right|\geq 10$$

in which $c=d/p$ and $x=87$ μm/p.

6. The display device of claim 5, wherein the scattering coefficient s is smaller than or equal to −0.7728, and the distance d is smaller than or equal to 0.28 mm.

7. The display device of claim 5, wherein the scattering coefficient s is smaller than or equal to −0.8828, and the distance d is smaller than or equal to 0.68 mm.

8. The display device of claim 1, wherein a value of c is smaller than or equal to 2.

9. The display device of claim 8, wherein the value of c is smaller than or equal to 0.256.

10. The display device of claim 1, wherein the display panel includes a color determining layer, and the color determining surface is the top surface of the color determining layer facing the haze layer.

11. A display device, comprising:
a display panel having a first pixel, a second pixel and a color determining surface, wherein an orthogonal projection of the first pixel and that of the second pixel respectively form a first pixel range and a second pixel range respectively, the first pixel range having a first edge adjoining the second pixel range; and
a haze layer disposed on a side of the color determining surface and having a haze surface facing away from the color determining surface, the haze layer having a scattering coefficient ranging from −1.4 to 0,
wherein the haze surface includes:
a first location corresponding to a center of the first pixel range; and
a second location corresponding to a location away from the first edge towards the second pixel range, wherein a distance between the first edge and the second location ranges from 87 μm to 174 μm, and
when the first pixel is in full bright and the second pixel is in full dark, the brightness at the first location is ten times greater than that at the second location.

12. The display device of claim 11, wherein when the first pixel is in full bright and the second pixel is in full dark, the brightness at the center of the second pixel range is smaller than or equal to 10% of the brightness at the center of the first pixel range.

13. The display device of claim 11, wherein the haze surface defines a reference surface, in which the color determining surface is spaced apart from the reference surface by a distance d, the scattering coefficient s is smaller than or equal to −0.512, and the distance d is smaller than or equal to 0.28 mm.

14. The display device of claim 11, wherein the haze surface defines a reference surface, in which the color determining surface is spaced apart from the reference surface by a distance d, the scattering coefficient s is smaller than or equal to −0.796, and the distance d is smaller than or equal to 0.68 mm.

15. The display device of claim 11, wherein the first pixel range has a width p, and wherein the haze surface defines a reference surface, in which the color determining surface is spaced apart from the reference surface by a distance d, and a ratio of the distance to the width (d/p) is smaller than or equal to 2.

16. The display device of claim 15, wherein the ratio of the distance to the width (d/p) is smaller than or equal to 0.256.

17. The display device of claim 11, wherein the display panel includes a color determining layer, and the color determining surface is the top surface of the color determining layer facing the haze layer.

* * * * *